(12) United States Patent
Kawaguchi et al.

(10) Patent No.: US 11,049,688 B2
(45) Date of Patent: Jun. 29, 2021

(54) CHARGED PARTICLE BEAM IRRADIATION APPARATUS

(71) Applicant: NuFlare Technology, Inc., Yokohama (JP)

(72) Inventors: Michihiro Kawaguchi, Mishima (JP); Kiminobu Akeno, Yokohama (JP); Keita Ideno, Yokosuka (JP); Kota Iwasaki, Atsugi (JP); Keisuke Goto, Kamakura (JP); Kiyoshi Nakaso, Sunto-gun (JP); Shintaro Yamamoto, Fujisawa (JP); Hitoshi Matsushita, Inzai (JP); Ryota Inoue, Inzai (JP); Yuki Fukuda, Inzai (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/586,254

(22) Filed: Sep. 27, 2019

(65) Prior Publication Data

US 2020/0105499 A1     Apr. 2, 2020

(30) Foreign Application Priority Data

Oct. 1, 2018   (JP) .............................. JP2018-186473

(51) Int. Cl.
*H01J 37/244*     (2006.01)
*H01J 37/02*      (2006.01)
(Continued)

(52) U.S. Cl.
CPC .......... *H01J 37/244* (2013.01); *H01J 37/023* (2013.01); *H01J 37/268* (2013.01); *H05H 7/001* (2013.01)

(58) Field of Classification Search
USPC ....................................................... 250/311
See application file for complete search history.

(56) References Cited

U.S. PATENT DOCUMENTS 6,217,158 B1 *  4/2001  Kanaya ................ B41J 2/14209
                                                          347/70
6,710,338 B2 *  3/2004  Gerlach .................. H01J 37/08
                                                          250/306

(Continued)

FOREIGN PATENT DOCUMENTS

JP     2001-140972 A    5/2001
JP     2011-140972 A    7/2011

OTHER PUBLICATIONS

Yoshiya Nakamura et al., "Study on Active Micro-vibration Control System using Hybrid Actuators", Fujita Technical Research Report No. 41, 2005, 17 pages (with English Translation).

(Continued)

*Primary Examiner* — Phillip A Johnston
(74) *Attorney, Agent, or Firm* — Oblon, McClelland, Maier & Neustadt, L.L.P.

(57) ABSTRACT

A charged particle beam irradiation apparatus according to an embodiment includes: an optical column; a stage; a mount supporting the stage; a chamber provided on the mount and supporting the optical column; a detector configured to detect movement of the stage; actuator units each including a curved plate, a piezoelectric element, and a connector connected configured to transmit a first force generated by a change of the curvature of the curved plate to the mount; and an actuator control circuit configured to control the voltage applied to the piezoelectric element of each of the actuator units based on movement information, so that the first force is transmitted from the actuator units to the mount against a second force acting on the mount due to the movement of the stage.

18 Claims, 6 Drawing Sheets

(51) Int. Cl.
 *H01J 37/26* (2006.01)
 *H05H 7/00* (2006.01)

(56) References Cited

U.S. PATENT DOCUMENTS

| | | | | |
|---|---|---|---|---|
| 7,238,938 B2* | 7/2007 | Trevor | .................... | H01J 37/09 |
| | | | | 250/305 |
| 7,538,473 B2* | 5/2009 | Blandino | .............. | B06B 1/0238 |
| | | | | 310/316.03 |
| 8,912,491 B2* | 12/2014 | Schoenmakers | ... | G01N 23/2251 |
| | | | | 250/307 |
| 8,946,631 B2* | 2/2015 | Noji | .................... | H01L 21/6833 |
| | | | | 250/311 |
| 9,919,418 B2* | 3/2018 | Hashimoto | ................ | B25J 9/12 |
| 2008/0211349 A1* | 9/2008 | Seya | .................... | H02N 2/0025 |
| | | | | 310/323.02 |

OTHER PUBLICATIONS

Masaharu Tagami et al., "Development of an Active Vibration Canceling System Using Inertial Force Generators", Transactions of the Japan Society of Mechanical Engineers (Part C) vol. 73, No. 735 Nov. 2007, 20 pages (with English Translation).

\* cited by examiner

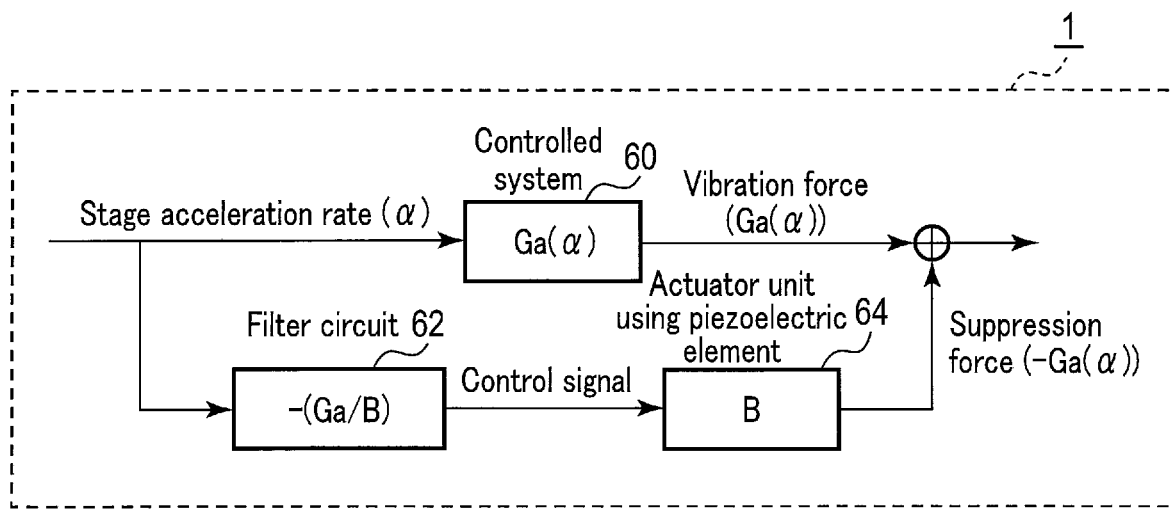
F I G. 1

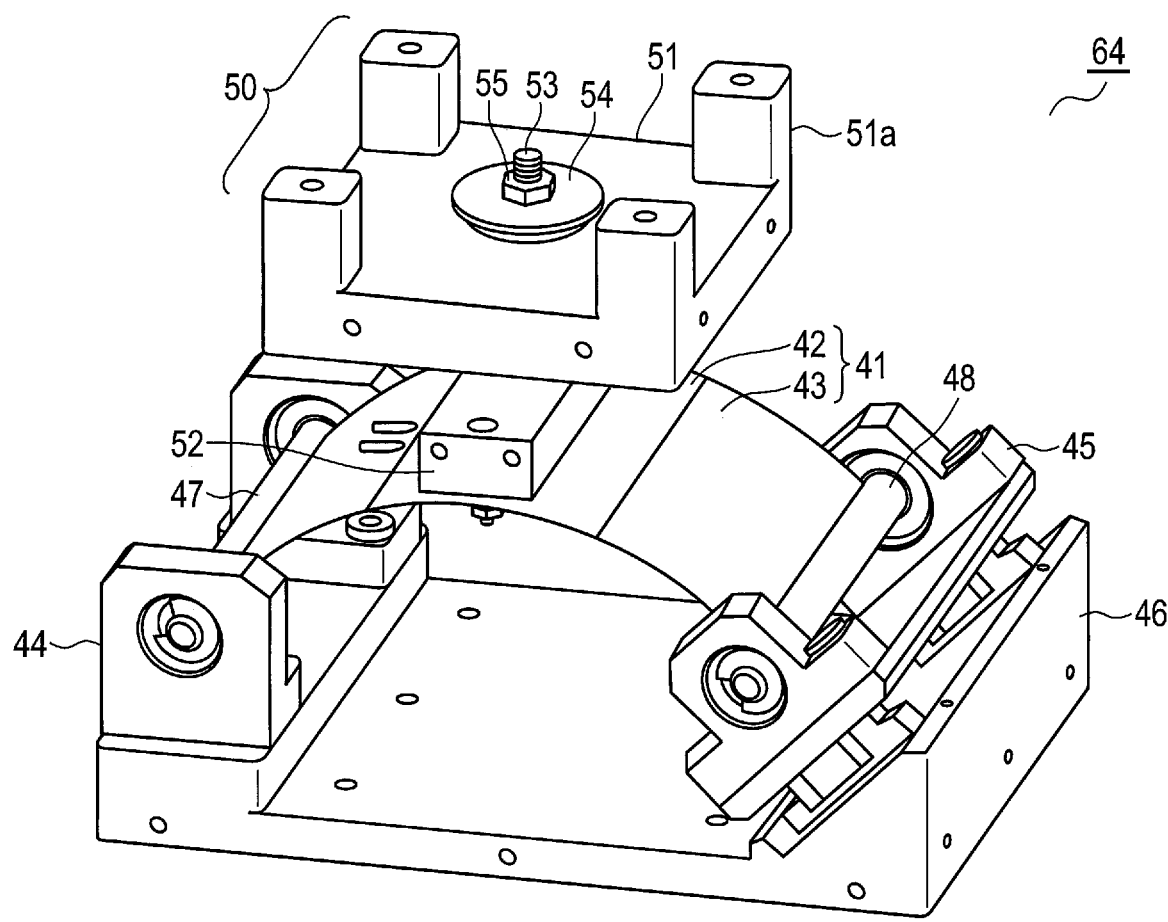
F I G. 2

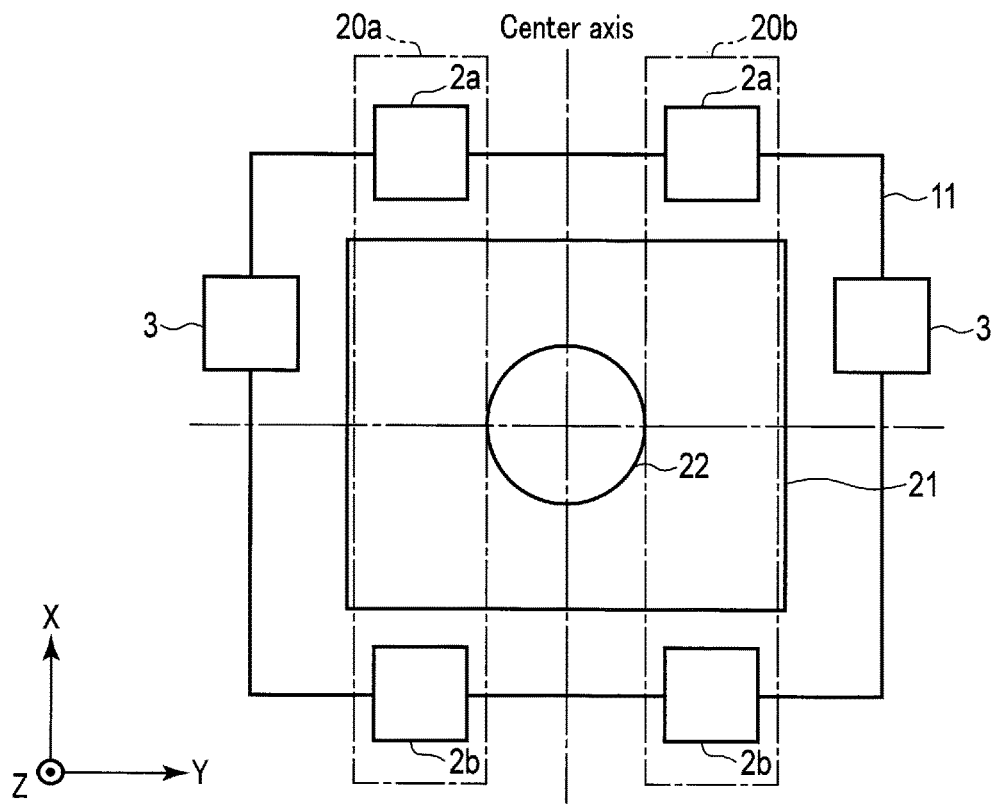
F I G. 5
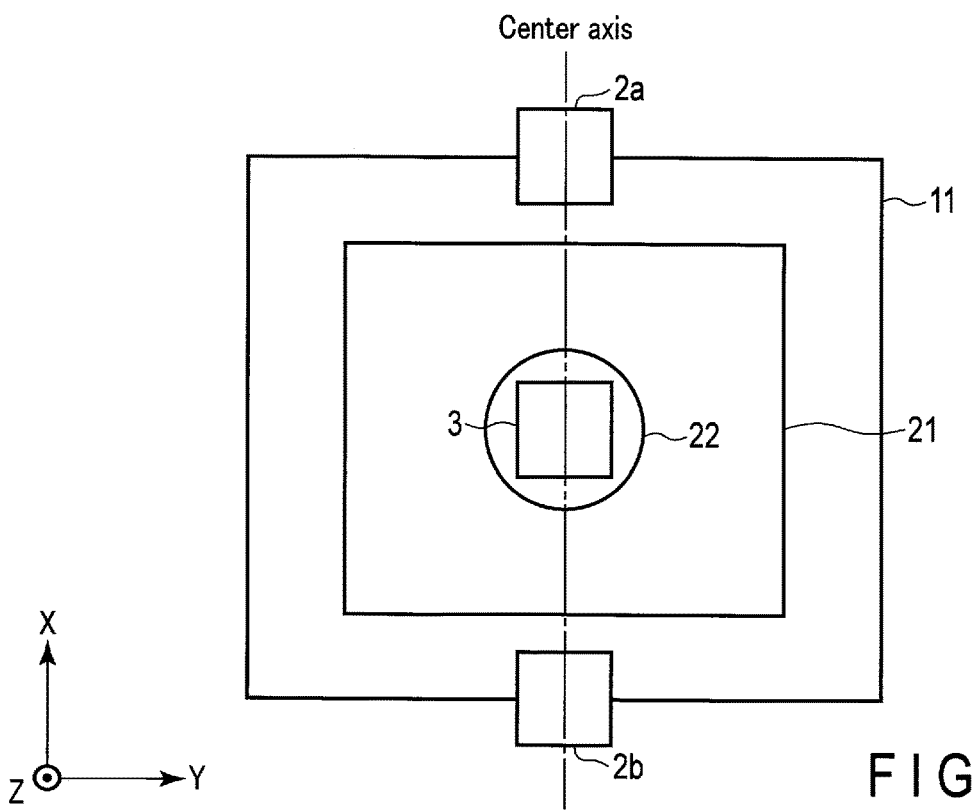
F I G. 6

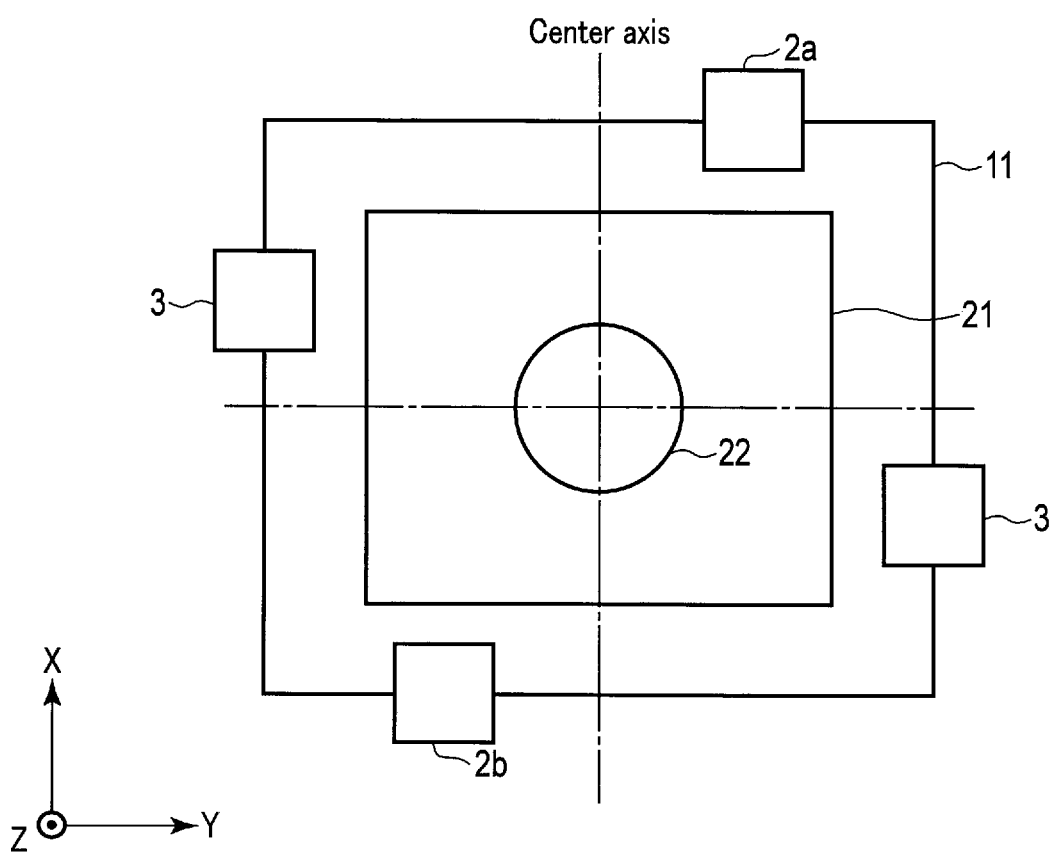
F I G. 7

CHARGED PARTICLE BEAM IRRADIATION APPARATUS

CROSS-REFERENCE TO RELATED APPLICATIONS

This application is based upon and claims the benefit of priority from Japanese Patent Application No. 2018-186473, filed Oct. 1, 2018, the entire contents of which are incorporated herein by reference.

FIELD

The present invention relates generally to a charged particle beam irradiation apparatus that irradiates a charged particle beam on a target object, such as a mask or wafer, for use in semiconductor manufacturing.

BACKGROUND

A charged particle beam irradiation apparatus includes various vibration control mechanisms and vibration control systems to suppress vibrations or shakes in order to realize writing with a high accuracy.

Generally, an apparatus that needs vibration prevention is placed on a vibration-isolated table including a vibration isolation mechanism. The vibration-isolated table isolates the apparatus from floor violation.

If the apparatus includes an object with mass (e.g., a stage) having a configuration that moves on the vibration-isolated table, the apparatus causes the vibration-isolated table to vibrate due to a reaction force generated by the movement of the object and shift of the center of gravity of the object.

For example, Jpn. Pat. Appln. KOKAI Publication No. 2001-140972 discloses a photolithography apparatus used in semiconductor fabrication. The photolithography apparatus includes a stage, on which a wafer can be placed, as an object that moves on the vibration-isolated table. The photolithography apparatus also includes a linear motor which generates a force applied to the vibration-isolated table. The photolithography apparatus calculates a rate of acceleration (corresponding to a reaction force applied to the vibration-isolated table) from the position of the stage to suppress vibrations due to reaction force generated by the movement of the stage and shift of the stage's center of gravity. The photolithography apparatus feeds forward the calculated rate of acceleration to the linear motor, and cancels out the reaction force applied to the vibration-isolated table with the force generated by the linear motor, thereby suppressing vibrations of the vibration-isolated table.

The conventional photolithography apparatus described above uses the linear motor to apply, to the vibration-isolated table, the force for canceling the reaction force due to the movement of the stage.

However, if the vibration isolation by the linear motor as described above is applied to the charged particle beam irradiation apparatus, there is a problem that the beam trajectory of the charged particle beam emitted from the apparatus will be altered under the influence of a change in magnetic field due to the magnetic field generated by the linear motor. Furthermore, if a linear motor is used, various measures are needed to avoid the situation where influence is caused by the magnetic field of the linear motor. As a result, the apparatus configuration is inevitably large and heavy, which increases the manufacturing cost.

SUMMARY

An object of the present invention is to provide a charged particle beam irradiation apparatus capable of suppressing vibrations caused by a movement of a movable object (for example, a stage), through a compact and simple structure and without influencing the trajectory of the charged particle beam.

A charged particle beam irradiation apparatus according to an embodiment includes: an optical column including a charged particle beam irradiation mechanism configured to irradiate a charged particle beam to a target object; a stage including a stage surface on which the target object is to be placed, and configured to move in two orthogonal axis directions so that the charged particle beam is irradiated to a preset position on the target object; a mount supporting the stage; a chamber provided on the mount and supporting the optical column; a detector configured to detect movement of the stage; actuator units, each including a curved plate formed of a flexible material, a piezoelectric element provided on the curved plate and configured to change a curvature of the curved plate through expansion and contraction that occur due to application of a voltage, and a connector connected to a curved portion of the curved plate and configured to transmit a first force generated by a change of the curvature of the curved plate to the mount; and an actuator control circuit configured to control the voltage applied to the piezoelectric element of each of the actuator units based on movement information, so that the first force is transmitted from the actuator units to the mount against a second force acting on the mount due to the movement of the stage.

BRIEF DESCRIPTION OF THE DRAWINGS

FIG. 1 is a diagram illustrating a conceptual configuration of a vibration control apparatus according to an embodiment.

FIG. 2 is a perspective view illustrating an example of an external configuration of an actuator unit used in the vibration control apparatus.

FIG. 5 is a diagram illustrating a first example of placement of actuator units.

FIG. 6 is a diagram illustrating a second example of placement of actuator units.

FIG. 7 is a diagram illustrating a third example of placement of actuator units.

DETAILED DESCRIPTION

Figure 3:
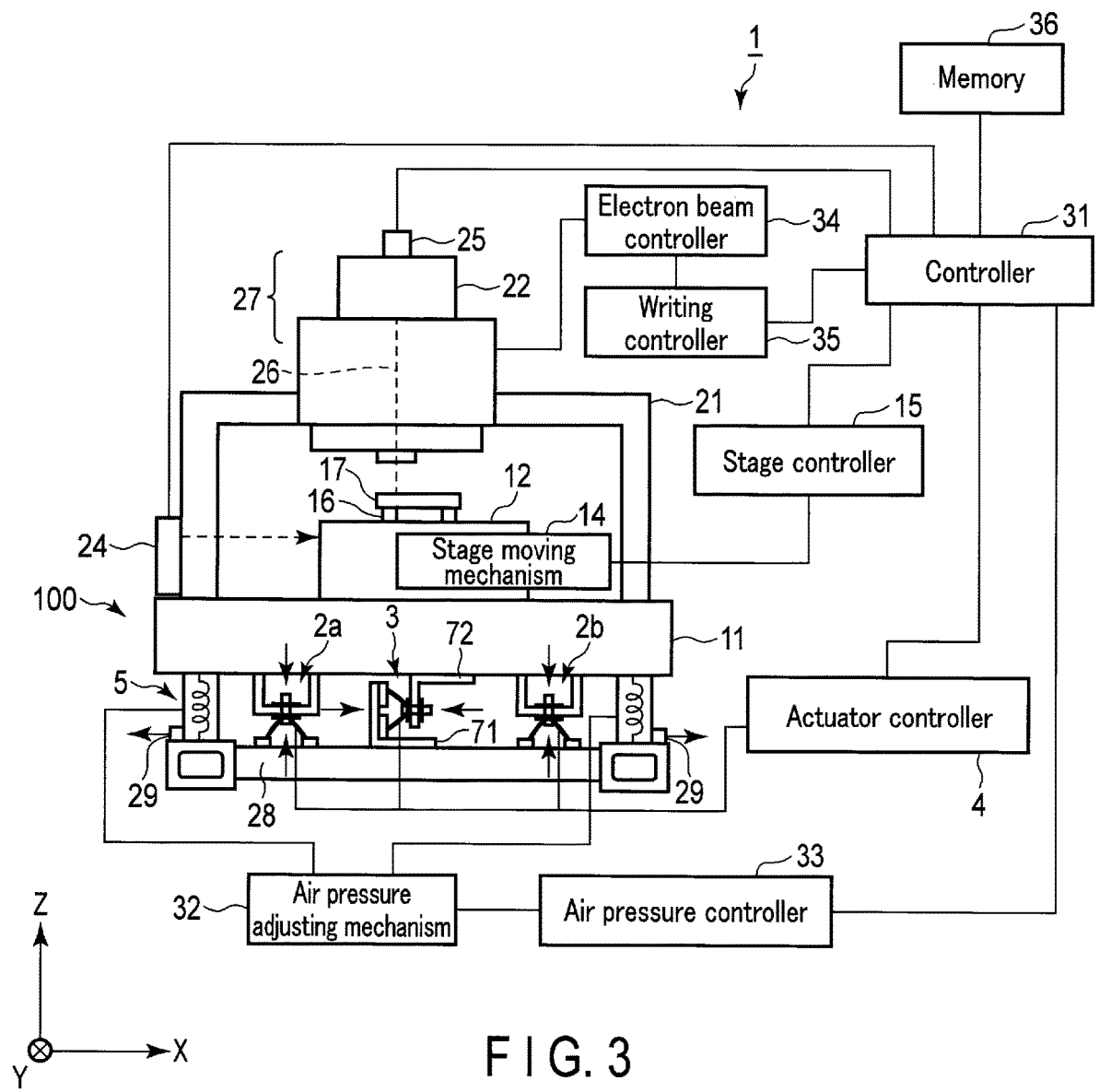
FIG. 3 is a diagram illustrating a schematic configuration of the charged particle beam irradiation apparatus according to the embodiment.

A vibration control apparatus which is used in a charged particle beam irradiation apparatus according to an embodiment of the present invention will be explained with reference to the drawings.

FIG. 1 is a diagram illustrating a conceptual configuration of a vibration control apparatus according to an embodiment. The vibration control apparatus is applied in a charged particle beam irradiation apparatus 1, to be described later with reference to FIG. 3.

The charged particle beam irradiation apparatus 1 is used to write a pattern on a mask for use in semiconductor manufacturing. The charged particle beam irradiation apparatus 1 moves the mask when writing the pattern, and irradiates a charged particle beam to a predetermined position of the mask (a preset position). The charged particle beam irradiation apparatus 1 moves the mask within a plane perpendicular to a direction of irradiation of the charged particle beam. Therefore, the mask is mounted on a stage that is movable along two axes (an X axis and a Y axis) which intersect at right angles in that plane. When the stage moves, a shift of the center of gravity of the stage, inertial force due to acceleration and deceleration (positive and negative rate of acceleration) of the movement of the stage, etc., will act upon the stage. Such inertial force causes a mount, which is mounted with the stage, to generate the force required to move the mount (hereinafter referred to as "vibration force"). The vibration force may be a cause of mount vibration. The vibration force includes a component of force (also referred to as "a horizontal vibration force") in a direction along a direction of movement of the stage (for example, in the X axis direction), and a component of force (also referred to as "a vertical vibration force") in a direction perpendicular to a surface of the stage on which the target object is placed (hereinafter referred to as "a stage surface") (for example, the direction of center of gravity, if the stage moves horizontally). For example, if the stage accelerates or decelerates while moving in the X axis direction, a reaction force of the inertial force acting on the stage in the X axis direction (mass of the stage×rate of acceleration) acts on the mount as a force to move the mount in the horizontal direction. The force to move the stage in the horizontal direction becomes the horizontal vibration force. The vibration force in the Z direction acts on the mount as a force to generate a rotation moment (ΘY) around the Y axis direction. Pattern writing on the mask requires a very high accuracy. Therefore, it is important for the charged particle beam irradiation apparatus 1 that the positional relationship between the charged particle beam and the write position of the mask is unchanged by the vibration force.

As shown in FIG. 1, the charged particle beam irradiation apparatus 1 performs the control required to prevent vibrations from generating at the mount by canceling at least one of "a vibration force in the direction along the direction of movement of the stage" and "a vibration force in the direction perpendicular to the stage surface", which occur due to the movement of the stage. Regarding the other of the aforementioned vibration forces which occur due to the movement of the stage, the charged particle beam irradiation apparatus 1 also has a control system similar to that shown in FIG. 1. Aside from the vibration forces which occur due to the movement of the stage, vibration occurring at the position where the charged particle beam irradiation apparatus 1 is situated (called "vibration disturbance in the apparatus environment") must be removed so as to avoid an influence on the mount. As will be described later, the control system to remove the vibration disturbance in the apparatus environment is provided separately from the control system shown in FIG. 1.

The charged particle beam irradiation apparatus 1 includes a controlled system 60, a filter circuit 62, and an actuator unit 64 using a piezoelectric element.

The controlled system 60 represents a target of vibration control by the feedforward control system used in the charged particle beam irradiation apparatus 1 of the embodiment. For example, the stage, the mount, or an optical column is included as the controlled system 60. Assuming that a response characteristic of the controlled system 60 is Ga, Ga (α) represents a response characteristic with respect to a rate of acceleration a of the speed of movement of the stage of the controlled system (stage, mount, optical column, etc.), to which a vibration force is applied in accordance with the movement of the stage (hereinafter simply referred to as "rate of acceleration of the stage"). In other words, response characteristic Ga (α) represents a response characteristic of one component of the vibration forces acting from the stage to the mount by the movement of the stage (horizontal vibration force along the direction of movement of the stage or vertical vibration force in a direction perpendicular to the stage surface) relative to the rate of acceleration a applied to the stage. The vibration occurring in the direction of that component can be suppressed by canceling out the vibration force. To cancel out vibration forces of a plurality of components, force is required to cancel out the vibration force in the direction against each of the components of the vibration forces (hereinafter referred to as "suppression force").

The system including the filter circuit 62 and the actuator unit 64 using a piezoelectric element is a feedforward control system that generates the suppression force to cancel out one of the components of the vibration forces, which act on the mount from the stage due to the movement of the stage. In this embodiment, for example, the actuator unit 64 using a piezoelectric element, as will be described later with reference to FIG. 2, is used as the actuator unit to generate the suppression force. The actuator unit 64 has a response characteristic B between a control signal (for example, a voltage applied to the piezoelectric element) and a suppression force which the actuator unit 64 can apply to the mount. The filter circuit 62 is designed to apply a suitable control signal (voltage) to the actuator unit 64, so that the actuator unit 64 can generate a suitable suppression force (−Ga(α)). Thus, the filter circuit 62 has a response characteristic −(Ga/B) between the rate of acceleration a applied to the stage and the control signal (voltage).

The response characteristic Ga between the rate of acceleration applied to the stage (or the position and speed of the stage) and the vibration force can be confirmed by experiments of the vibration forces generated when various rates of acceleration are applied to the stage (or the stage is placed in various locations or various speeds are applied to the stage). For example, the rate of acceleration can be measured by applying various rates of acceleration (or the position and speed of the stage) to the stage, monitoring a displacement response of the mount at that time, and twice differentiating the displacement response of the mount by time (the rate of acceleration multiplied by the mass of the mount corresponds to the acting force). For this purpose, the mount may be provided with a displacement sensor to measure a displacement of the mount, or an acceleration sensor to measure a rate of acceleration that occurs at the mount (for example, an acceleration sensor 25a in FIG. 4). Furthermore, as described above, prevention of vibrations at the mask surface for the charged particle beam is required. To stabilize the charged particle beam, it is also necessary to prevent vibrations of the optical column provided with an irradiation optical system for the charged particle beam. Therefore, the feedforward control system capable of controlling vibrations can also control vibrations of the optical column by using a displacement sensor or an acceleration sensor (for example, the acceleration sensor 25b in FIG. 4) provided in the optical column, instead of measuring the displacement of the mount.

Figure 4:
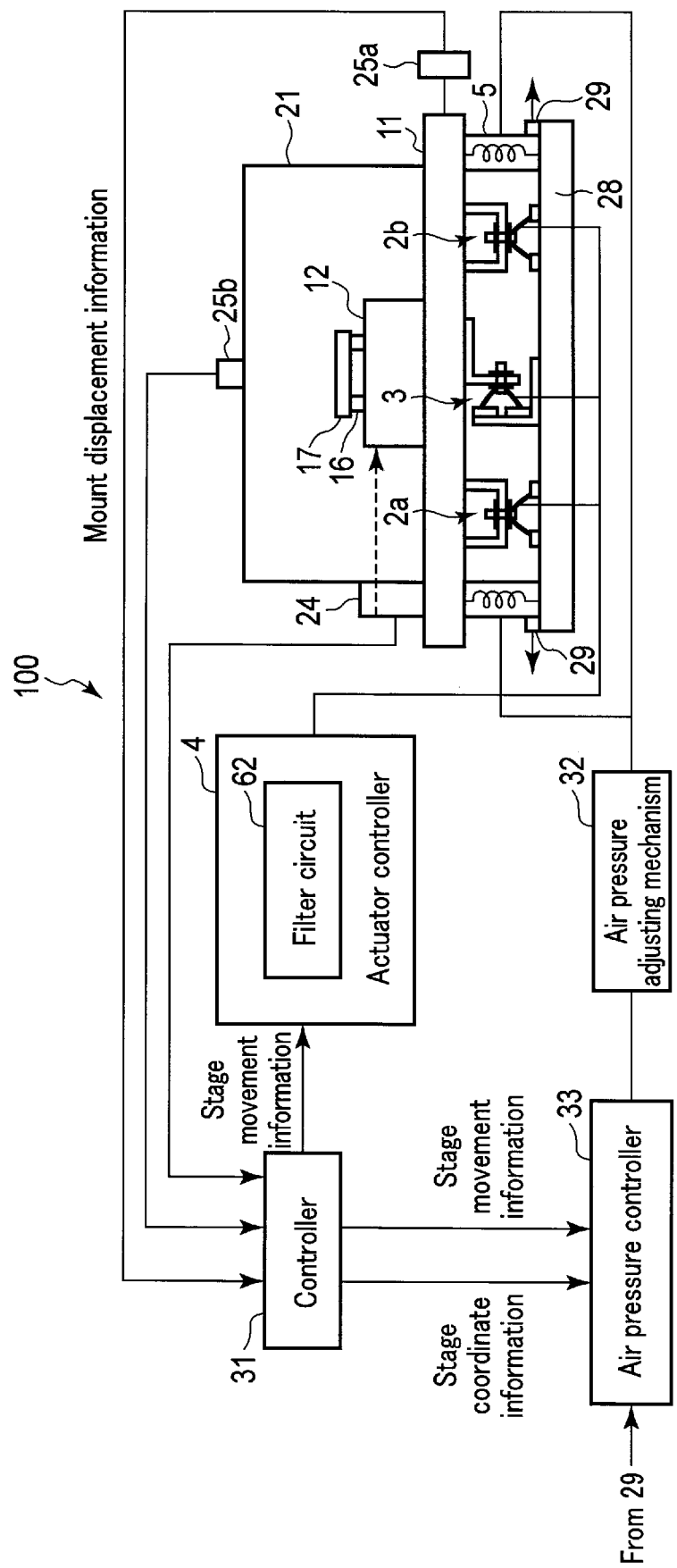
FIG. 4 is a diagram for explaining operations of the vibration control apparatus.

The acceleration sensors 25a and 25b shown in FIG. 4 may be, for example, triaxial acceleration sensors. The triaxial acceleration sensors detects vibrations generated at the optical column 27 and a chamber 21 as vibration information divided in the X axis, the Y axis, and a Z axis, which intersect at right angles. In the optical column 27, the amplitude of vibrations in the horizontal direction increases as the distance from the mount, which directly or indirectly supports the optical column 27, increases. More specifically, as shown in FIG. 3 to be described later, the optical column 27 is supported by the chamber 21, and the chamber 21 is, in turn, supported by the mount 11. Therefore, in this embodiment, the acceleration sensor 25b is located, for example, on top of the optical column 27, which is most distant from the mount, the stage, and the target object on the stage. The acceleration sensors 25a and 25b are placed on different positions of the apparatus, depending on the frequency of vibrations generated in the charged particle beam irradiation apparatus 1. However, they are preferably placed at positions where vibrations of the largest amplitude are applied. By specifying the response characteristic Ga based on the vibration information detected by the acceleration sensor 25, the vibration control apparatus in the present embodiment can suppress the vibrations that occur at the optical column 27 due to the movement of the stage 12. The shape and weight balance of the optical column 27 may vary depending on the specification thereof. The embodiment is applicable to the optical column 27 of various specifications by determining the response characteristic Ga mentioned above.

If the response characteristic Ga is determined by the above-mentioned method, the response characteristic (−(Ga/B)) of the filter circuit 62 is determined, since the response characteristic B of the actuator unit 2 is known. The response characteristic Ga of the controlled system 60 (the stage) may be selectively reflected by a vibration force to be suppressed in accordance with the frequency, the property of the vibration force corresponding to the position of the stage relative to the mount, etc. Thus, the response characteristic of the filter circuit 62 can be appropriately determined in accordance with the vibration force to be suppressed. The response characteristic of the filter circuit 62 can be set in accordance with the assumed frequency of vibrations. The response characteristic of the filter circuit 62 may be set in consideration of a change of the frequency of vibrations that occur due to the movement of the stage 12, for example, so as to correspond to vibrations of a frequency or a specific frequency band by changing the gain. For example, if the filter circuit 62 has a response characteristic such that the mount is liable to vibrate with respect to the stage acceleration rate in a certain range, the feedforward control system may be designed to respond sensitively in the range of the stage acceleration rate. The response characteristic of the filter circuit 62 may be stored in a memory by mapping an input (a position, speed, or rate of acceleration) and an output (a control signal=a value of voltage to be input to the actuator unit 2). Further, the map may be switched in accordance with the position or acceleration rate of the stage.

In FIG. 1, the response characteristic Ga is shown on the assumption that the stage acceleration rate α is input to the control system. However, the speed is obtained by differentiating the displacement of the stage by time, and the rate of acceleration is obtained by twice differentiating the displacement of the stage by time, or by differentiating the speed by time. Therefore, the feedforward control system of the present embodiment may be any control system to which movement information on the stage (a displacement, speed, or rate of acceleration) is input.

An embodiment of the actuator unit 64, using a piezoelectric element shown in FIG. 1, will be explained with reference to FIG. 2.

As shown in FIG. 2, the actuator unit 64 includes a curved type actuator body 41, a fixed bearing 44, a movable bearing 45, a pedestal 46, rotation shafts 47 and 48, and a connection unit (a connector) 50. The curved type actuator body 41 causes a displacement in vertical directions at a top of the curve by a piezoelectric element changing the curvature of the curve, thereby generating a force in the direction of displacement. The curved type actuator body 41 includes a core member 42 and a piezoelectric element 43. The core member 42 is formed of a flat plate, for example, a flexible metal plate. The core member 42 is used as a plate spring which comes to have a desired tension by curving. In this embodiment, the core member 42 is bent to project toward the mount 11.

The piezoelectric element 43 has a thin plate shape and adheres to at least one surface of the core member 42. The piezoelectric element 43 deforms integrally along with the core member 42 and changes the curve (curvature) of the core member 42.

The piezoelectric element 43 is electrically coupled to the filter circuit 62 shown in FIG. 1. The piezoelectric element 43 is for example, a sheet-shaped membrane-type piezoelectric element having flexibility. The membrane-type piezoelectric element has a structure covered with epoxy resin. In the structure, electrodes are formed on both surfaces of a fiber sheet made of fibrous piezoelectric ceramic bundles on polyimide film. The piezoelectric element 43 expands and contracts in predetermined directions (in this embodiment, the longitudinal directions of the core member 42) in accordance with the control signal (voltage) applied by the filter circuit 62. The degree of curve (curvature) of the core member 42 changes in accordance with the expansion and contraction of the piezoelectric element 43.

In the curved type actuator body 41, for example, if a positive voltage is applied to the piezoelectric element 43, the piezoelectric element 43 is deformed so as to expand, and the core member 42 is curved (elastically deformed) to a higher degree, increasing its curvature. In contrast, if a negative voltage is applied to the piezoelectric element 43, the piezoelectric element 43 is deformed so as to contract, and the core member 42 is curved to return, decreasing its curvature.

The core member 42 is, for example, a rectangle, and the rotation shafts 47 and 48 are attached to the ends of the short sides. The fixed bearing 44 is attached to one of the rotation shafts, i.e., the rotation shaft 47. The movable bearing 45 is attached to the other rotation shaft 48. The fixed bearing 44 and the movable bearing 45 are fixed to the pedestal 46, which has a flat portion and a slope portion at one end of the flat portion. The fixed bearing 44 is fixed to the flat surface of the pedestal 46. The movable bearing 45 is fitted in a guide rail (not shown), provided along a slope surface of the slope portion of the pedestal 46, and movable along the slope direction. Through the sliding of the movable bearing 45, the curved type actuator body 41 can be easily deformed upon change of the curvature.

When the piezoelectric element 43 is deformed to expand and the curvature of the deformed core member 42 is increased, the top portion of the core member 42 moves upward in the drawing due to the core member 42 being supported by the rotation shafts 47 and 48. Thus, a force for pushing the stage is generated. In contrast, when the piezoelectric element 43 is deformed to contract and the curvature of the deformed core member 42 is decreased, the top portion of the core member 42 moves downward in the drawing. Thus, a force for returning the stage in this direction is generated. The movable bearing 45 is not essential, and the fixed bearing 44 may be used in place of the movable bearing 45.

The connection unit 50, to be connected to the mount on which the stage is mounted, is provided on the top portion of the projection of the core member 42. The connection unit 50 includes a mount fixing member 51, a connection base member 52, a shaft member (rod screw or a stud bolt) 53, an elastic member 54, and a nut 55. The force generated at the top portion of the curve of the core member 42 is transferred to the mount via the connection unit 50. This force serves as the suppression force in FIG. 1.

The mount fixing member 51 is formed of a metal material, and includes four support legs 51a and a flat attachment portion. The mount fixing member 51 is fixed by the four support legs 51a screwed to the mount 11. The connection base member 52 is a rigid plate member having a length corresponding to that of the short side of the core member 42. The connection base member 52 is placed in the top portion of the projection of the core member 42, along the short side of the core member 42, and fixed to sandwich the core member 42 between upper and lower surfaces of the core member 42.

The elastic member 54 is formed of, for example, a ring-shaped plate rubber. For example, the elastic member 54 is provided between the core member 42 and the connection base member 52, and on the mount fixing member 51. A screw hole is formed through the core member 42, a flat central portion of the mount fixing member 51, and the connection base member 52. The shaft member 53 is inserted through the core member 42, the elastic member 54, the connection base member 52, the mount fixing member 51, and the elastic member 54, which are overlaid. Then, the nuts 55 are screwed to both ends of the shaft member 53. When the curving condition of the core member 42 changes, the elastic member 54 serves as a buffer which prevents the steep application of a load to the core member 42. The elastic member 54 may not necessarily be provided between the core member 42 and the connection base member 52. The mount fixing member 51 is fixed by the four support legs 51a screwed to the mount 11.

The actuator unit 64, using a piezoelectric element, is advantageous in that a response to a change in input voltage is higher than that of an actuator using a magnetic force, such as a linear motor, to respond to frequency variation from a low frequency to a high frequency, and impulsive variations that appear in a short period of time. The actuator unit 64 using a piezoelectric element is also advantageous in that the charged particle beam is stable, since an influence of the magnetic field on the charged particle beam is suppressed.

FIG. 3 is a diagram illustrating a schematic configuration of the charged particle beam irradiation apparatus 1 according to the embodiment. The charged particle beam irradiation apparatus 1 writes a fine pattern on a semiconductor substrate or a photomask original form using a charged particle beam. The vibration control apparatus 100 included in the charged particle beam irradiation apparatus 1 of the embodiment is applicable to any apparatus that requires the vibration control apparatus, for example, an observation apparatus including an electron microscope (SEM: scanning electron microscope, a scanning type microscope, etc.) and a mask inspection apparatus.

As shown in FIG. 3, the charged particle beam irradiation apparatus 1 includes the vibration control apparatus 100, the movable stage (target object stage) 12 for holding and moving a target object 17, the chamber 21 accommodating the stage 12, the optical column 27 mounted on the chamber 21, and the mount 11 located at a bottom of the chamber 21. Furthermore, the charged particle beam irradiation apparatus 1 includes a controller (a control circuit) 31 that controls the overall apparatus, an electron beam controller 34 that controls an electron gun 22 which emits a charged particle beam, a writing controller 35 to write a pattern on the target object 17 based on pattern design data, a memory 36 that stores processing information such as a program for processing and the pattern design data, a stage moving mechanism 14 to move the stage 12, and a stage controller 15 that controls the stage moving mechanism 14.

Each function of the controller 31, the electron beam controller 34, the writing controller 35, and the stage controller 15, and also an actuator controller (an actuator control circuit) 4 and an air pressure controller (an air pressure control circuit) 33, which are described later, may be realized by a dedicated circuit or a processor executing firmware. In the present embodiment described herein, a dedicated circuit is provided in the charged particle beam irradiation apparatus 1.

The chamber 21 is shaped as a hollow box made of a metal member, such as stainless alloy, and the mount 11 is located on the bottom of the chamber 21. The space surrounded by the chamber 21 and the mount 11 can be maintained at vacuum (low pressure). The mount 11 has a shape that conforms to the outer shape of the chamber 21; for example, a tetragon such as a rectangle or square, or a disk. The mount 11 supports the stage 12. Though not shown in the drawings, the chamber 21 has an opening through which the target object 17 is taken in and out, and has an openable and closable gate that hermetically covers the opening. While the gate is opening, the target object 17 is carried into the chamber 21 from outside by a target object carrying mechanism (not shown) and placed on the stage 12. Similarly, the target object 17 on which a pattern is written is taken off from the stage 12 and carried by the target object carrying mechanism out of the chamber 21. The chamber 21 and the mount 11 are not necessarily integrated as one unit. The chamber 21 itself may be a box that defines a hermetically closed space, and the box-shaped chamber 21 may be placed on the mount 11.

An exhaust system to evacuate the chamber 21 may be a combination of a dry pump for rough evacuation and an ion pump or turbo molecular pump for super-high vacuum evacuation (not shown).

The target object 17 is held by the holding member 16 fixed to the stage 12. The target object 17 is, for example, a photomask substrate principally composed of a glass substrate.

The optical column 27 is mounted on the chamber 21, and includes an electron gun 22, which is a light source for irradiating the target object 17 with the charged particle beam 26, and an electron optical system, namely, a charged particle beam irradiation mechanism. The electron optical system is located inside the optical column 27, and includes an illumination lens, an aperture, a projection lens, a polarizer, an object lens, etc. The electron optical system, under the control of the writing controller 35 and the electron beam controller 34, shapes and deflects the charged particle beam 26 emitted from the electron gun 22, and irradiates the target object 17 to scan. The charged particle beam irradiation apparatus 1 performs scanning with the charged particle beam 26 while moving the stage 12, and writes a desired pattern on the target object 17.

The stage moving mechanism 14 is controlled by the stage controller 15 and moves the stage 12 in a plane perpendicular to the charged particle beam 26. Generally, the stage moving mechanism 14 includes a mechanism that drives the stage 12 along the two axis (X axis and Y axis) that intersect at right angles in that plane. As the stage moving mechanism 14, a nonmagnetic vacuum motor, such as a linear ultrasonic motor, may be used. On an outer surface of the chamber 21, a stage position detector 24, such as an interferometer, which is a laser measuring device, is provided. The stage position detector 24 continuously irradiates the stage 12 with a measuring laser beam from outside the chamber 21, and detects a reflection light. The stage position detector 24 generates position information (distance of movement) of the stage 12 based on a measurement time between the measuring laser beam emission time and the reflection light reception time.

Alternatively, the controller 31 may calculate detection results obtained by the stage position detector 24 and generate position information of the stage 12. Generally, the stage position detector 24 is provided in each of the directions of movement of the stage by the stage moving mechanism 14, namely, in each of the X axis and the Y axis.

The controller 31 calculates and generates stage movement information (a moving speed, a rate of acceleration) by differentiating once or twice the change in position of the stage 12 by time based on the position information of the stage and time information of the measurement time obtained from the stage position detector 24. Therefore, the detection mechanism that detects stage movement information includes at least the stage position detector 24 and the controller 31 as components. The position information may be used to generate coordinate information (stage coordinate information) indicating a physical position of the stage 12 with reference to coordinates preset in the chamber 21. The stage coordinate information and the stage movement information of the stage 12 are fed back from the controller 31 to the stage controller 15, and used for control of the stage moving mechanism 14 and for positioning of the target object 17. When a pattern is written, the stage controller 15 controls the stage moving mechanism 14 to two dimensionally move the stage 12 (in the X axis direction and the Y axis direction), in accordance with the design data of the pattern to be written.

Besides the charged particle beam irradiation apparatus 1 described above, in the case of an observation apparatus, such as an electron microscope, a measurement recipe describing the position of the target object is to be measured is prepared in advance for each target object. Since the measurement recipe includes measurement position coordinates of each target object, the apparatus can determine a direction of movement or a distance of movement of the stage 12 based on the measurement position coordinates.

When the charged particle beam irradiation apparatus 1 writes a pattern in a very small region, it may deflect the charged particle beam for writing with the electron optical system in the optical column 27. In this case, the charged particle beam irradiation apparatus 1 moves the stage 12 when roughly moving the target object 17. The stage moving mechanism 14 may include a mechanism of adjusting the height of a target object by moving up and down the stage (in the Z axis direction: the direction of irradiation of the charged particle beam).

As the stage 12 moves in the chamber 21, the center of gravity of the stage 12 is displaced from the center of gravity of the mount 11. For example, when the stage 12 moves along the X axis direction and the center of gravity of the stage 12 is offset from the center of gravity of the mount 11 in the X axis direction, a rotation moment ($\Theta Y$) around the Y axis direction is applied to the mount 11. If the movement of the stage 12 is accelerated, the change in the rotation moment ($\Theta Y$) is steep. As the rate of acceleration increases, the change in the rotation moment ($\Theta Y$) applied to the mount 11 becomes steeper. Therefore, the rotation moment ($\Theta Y$) can be a factor of vibrations of the mount 11. Furthermore, if the movement of the stage 12 is accelerated or decelerated, a force in a direction opposite to the direction of the acceleration or deceleration (inertial force) is applied to the stage 12. For example, if the movement of the stage 12 in the X axis direction is accelerated or decelerated, an inertial force parallel to the X axis direction is applied to the stage 12. The inertial force applied to the stage 12 is transferred to the mount 11 as a reaction force, which can be a factor of vibrations of the mount 11.

The higher the rate of acceleration of the stage 12, the greater the influence of the force generated at the mount 11 (vibration force). In the charged particle beam irradiation apparatus 1, it is important that the charged particle beam 26 be accurately irradiated to a targeted position of the target object 17. Accordingly, the finer the pattern written by the charged particle beam irradiation apparatus 1, the greater the need for suppression of a relative displacement between the target object 17 and the electron optical system in the optical column 27.

For this purpose, the vibration control apparatus 100 generates a force to cancel the rotation moment ($\Theta Y$) applied to the mount 11, or a force to cancel the reaction force generated at the mount 11 by the inertial force applied to the stage 12. Accordingly, the vibration control apparatus 100 controls vibrations of the mount 11 or the optical column 27, or the mount 11 and the optical column (namely, prevents the mount 11 and the optical column 27 from vibrating).

An operation example of the vibration control apparatus 100 will be described with reference to FIG. 3 and FIG. 4.

The vibration control apparatus 100 includes a pair of first actuator units 2a and 2b using piezoelectric elements; a second actuator unit 3 using a piezoelectric element; a plurality of third actuator units 5 using an air pressure; the actuator controller 4 that controls the first actuator units 2a and 2b, and the second actuator unit 3 to control vibrations; an air pressure adjusting mechanism (an air pressure adjustor) 32 that adjusts the air pressure in the third actuator units 5; an air pressure controller 33 that controls the air pressure adjusting mechanism 32; the acceleration sensors 25a, 25b, and 29 which are a vibration measurement mechanism, a base stand 28, and L-shaped fixing members 71 and 72. The actuator unit 64 described with reference to FIG. 1 and FIG. 2 functions as the first actuator units 2a and 2b, and the second actuator unit 3.

The controller that controls the vibration control apparatus 100 may be provided in the controller 31 of the charged particle beam irradiation apparatus 1 or may be a dedicated controller. Detection values acquired from the displacement sensor or acceleration sensors 25a, 25b, and 29 are referred to as vibration information relating to the charged particle beam irradiation apparatus 1, to distinguish them from the movement information of the stage (the displacement of the stage, the moving speed of the stage, and the rate of acceleration of the stage), which are obtained by calculation from the detection values of the stage position detected by the stage position detector 24.

The actuator controller 4 includes a filter circuit 62 corresponding to each of the directions of vibration forces (components) which act on the mount 11 in accordance with the movement of the stage 12.

The filter circuit 62 is used to control vibrations by the feedforward control in accordance with the movement of the stage 12, as described above with reference to FIG. 1. Specifically, the actuator controller 4 including the filter circuit 62, the first actuator units 2a and 2b and the second actuator unit 3 using piezoelectric elements, control vibrations based on the movement information of the stage 12, obtained by using the stage position detector 24, to prevent vibrations of the mount 11 and the optical column 27 owing to vibration forces which occur by the movement of the stage 12. The control system corresponds to the feedforward control system (FIG. 1) to cancel out the vibration forces that occur by the movement of the stage 12. On the other hand, the air pressure controller 33, the air pressure adjusting mechanism 32, and the third actuator units 5 which use air pressure, control vibrations based on the vibration information acquired from the displacement sensor or acceleration sensor 25b, 29, etc. to principally remove the vibration disturbance in the apparatus environment.

This control system constitutes a feedback control system using the vibration information. The air pressure controller 33 also constitutes a feedforward vibration isolation system based on the stage coordinate information and the stage movement information. As shown in FIG. 4, a feedback/feedforward vibration isolation control system using the air pressure controller 33 is provided in parallel with the feedforward vibration control system using the actuator controller 4. Therefore, control parameters of the feedback/feedforward vibration isolation control system by air pressure can be set independently of control parameters of the feedforward vibration control system by the actuators through the use of piezoelectric elements. In other words, the pair of first actuator units 2a and 2b, the second actuator unit 3, and the third actuator units 5 can exert a force on the mount 11 in parallel independently in terms of position, independently in terms of time, and independently in terms of quantity of frequency.

Therefore, it is possible to perform vibration control in accordance with the characteristics (a direction of vibration force, a frequency of vibrations, a vibration mode, etc.) of various vibration sources to be controlled (vibration disturbance in the apparatus environment, movement of the stage 12, etc.). Furthermore, it is possible to set, for example, control parameters corresponding to the respective characteristics of the first actuator units 2a and 2b, the second actuator unit 3, and the third actuator units 5. Moreover, since the maintenance or adjustment of the feedback vibration isolation control system can be performed separately from the maintenance or adjustment of the feedforward vibration control system, the maintenance or adjustment work can be simple and easy.

As shown in FIGS. 3 and 4, the charged particle beam irradiation apparatus 1 includes, on the lower surface of the mount 11 (the surface opposite to the surface on which the stage 12 in the chamber 21 is disposed): the pair of first actuator units 2a and 2b each having a piezoelectric body; the second actuator unit 3 having a piezoelectric body; and the third actuator units 5 serving also as support legs of the apparatus and utilizing air pressure. The first actuator units 2a and 2b, the second actuator unit 3, and the third actuator units 5 are disposed on the base stand 28. The mount 11 is vibration-controlled by the first actuator units 2a and 2b, the second actuator unit 3, and the third actuator units 5, and does not exert an influence of the vibration on the stage 12, the mechanisms mounted on the stage 12, the chamber 21, and the optical column 27.

In this example, the second actuator unit 3 is disposed near the center of the base stand 28, and configured to cause the suppression force to act on the mount 11 near the center of gravity of the mount 11. The second actuator unit 3 generates the suppression force that is applied to the mount 11 and cancels out the reaction force of the inertial force applied to the stage 12. For example, the reaction force applied to the mount 11, due to the acceleration and deceleration of the stage 12 moving in the X axis direction, occurs in the X axis direction. Therefore, as shown in FIG. 3 and FIG. 4, to cause the suppression force generated by the second actuator unit 3 to act on the mount 11 in the X axis direction, the second actuator unit 3 is disposed so that the top portion of the curved core member 42 of the second actuator unit 3 is directed in the X axis direction (the direction of movement of the stage 12) using the L-shaped fixing member 71. The other L-shaped fixing member 72 is attached to the rear surface of the mount 11, and configured to cause the suppression force generated by the displacement of the top portion of the core member 42 of the second actuator unit 3 to act on the mount 11 in the X axis direction via the L-shaped fixing member 72.

Specifically, the second actuator unit 3 includes the curved type actuator body 41, the fixed bearing 44, the movable bearing 45, and the pedestal 46, as described before with reference to FIG. 2. Furthermore, the connection unit 50 includes the connection base member 52, the shaft member 53, the elastic member 54, and the nuts 55. It further includes the L-shaped fixing members 71 and 72 in place of the mount fixing member 51.

The second actuator unit 3 is fixed to the L-shaped fixing member 71 so that the curved type actuator body 41 extends in a direction perpendicularly to the mount surface of the base stand 28. One side of the L shape of the L-shaped fixing member 71 is fixed to the base stand 28. The pedestal 46 of the second actuator unit 3 is fixed to the other side of the L-shaped fixing member 71. One side of the L shape of the L-shaped fixing member 72 is attached to the lower surface of the mount 11. The other side of the L shape of the L-shaped fixing member 72 is fixed to the connection base member 52 of the second actuator unit 3 by means of the shaft member 53 and the nuts 55.

Thus, the second actuator unit 3 can cause the suppression force to act on the mount 11 in a direction parallel to the direction of movement of the stage 12 (for example, the X axis direction). As described above, for example, when the stage 12 is accelerated or decelerated while moving in the X axis direction, the reaction force of the inertial force acting on the stage 12 in the X axis direction (mass of the stage×rate of acceleration) corresponds to the vibration force applied to the mount 11 in the X axis direction. The second actuator unit 3 exerts the force (suppression force) that cancels out the vibration force in the X axis direction to the mount 11. Therefore, the second actuator unit 3 cancels the horizontal vibration force which vibrates the mount 11, and suppresses the horizontal vibrations of the chamber 21, the optical column 27, etc. of the charged particle beam irradiation apparatus 1.

The pair of first actuator units 2a and 2b are arranged on a line axis passing through the center of gravity and parallel to the X axis (not shown, hereinafter referred to as "a center axis"). At this time, the first actuator units 2a and 2b are disposed so that the top portion of the curved core member 42 of each of the first actuator units 2a and 2b is directed in the Z axis direction (the gravity direction). The pair of first actuator units 2a and 2b are provided to cancel out the moment $\Theta Y$ around the Y axis that acts on the mount 11 as described above. Therefore, the first actuator units 2a and 2b are disposed on the base stand 28 so that the suppression force generated by the displacement of the top portion of the core member 42 acts in a direction perpendicular to the stage surface. The actuator controller 4 controls the first actuator units 2a and 2b, so that the units generate suppression forces opposite to each other so as to cancel the moment $\Theta Y$.

Thus, the first actuator units 2a and 2b generate the suppression forces that cancel out the vibration forces acting on the mount 11 in the direction perpendicular to the direction of the surface of the stage 12 (the Z axis direction). If the table surface of the mount 11 on which the stage 12 is mounted is in a direction (horizontal direction) perpendicular to the gravity direction, the first actuator units 2a and 2b generate the suppression force in the gravity direction.

The actuator controller 4 applies a voltage (positive voltage or negative voltage) to the piezoelectric element 43 based on the stage movement information (for example, the rate of acceleration of the stage) obtained from the movement of the stage 12 measured by the stage position detector 24 and received from the controller 31. Thus, the actuator controller 4 exerts the suppression force acting in the vertical directions indicated by the arrows (FIG. 3), to the mount 11 from the first actuator units 2a and 2b, through the connection unit 50 (FIG. 2). Accordingly, the vibrations generated at the mount 11 can be suppressed.

For example, an explanation will be given below for a case in which the table surface of the mount 11 is placed horizontally and the first actuator unit 2a or 2b applies the suppression force to the mount 11 upward in a gravity direction. The actuator controller 4 applies a positive voltage to the piezoelectric element 43 of the first actuator unit 2a or 2b. Due to the application of the positive voltage, the piezoelectric element 43 expands and the curvature of the core member 42 increases. Thus, the core member 42 is deformed so as to expand upward. Since the core member 42 is deformed in a direction in which the top portion of the curved core member 42 becomes higher, the core member 42 applies the suppression force to the mount 11 via the connection unit 50 in a direction in which the mount 11 is raised. The suppression force cancels out the moment (vibration force) acting on the mount 11 downward in the gravity direction.

In the same example, a case in which the first actuator unit 2a or 2b applies the suppression force to the mount 11 downward in the gravity direction will be explained. The actuator controller 4 applies a negative voltage to the piezoelectric element 43 of the first actuator unit 2a or 2b. Due to the application of the negative voltage, the piezoelectric element 43 contracts and the curvature of the core member 42 decreases. Thus, the core member 42 is deformed so as to spread. Since the core member 42 is deformed in a direction in which the top portion of the curved core member 42 becomes lower, the core member 42 applies the suppression force to the mount 11 via the connection unit 50 in a direction in which the mount 11 is lowered. The suppression force cancels out the moment (vibration force) acting on the mount 11 upward in the gravity direction.

In this example, the actuator controller 4 controls the first actuator units 2a and 2b so that one of them generates the suppression force upward in the gravity direction and the other generates the suppression force downward in the gravity direction. As a result, the moment in the gravity direction to vibrate the mount 11 is canceled, and accordingly the vibrations of the mount 11 are suppressed.

The base stand 28, on which the actuator units 2a, 2b, 3, and 5 are mounted, supports the charged particle beam irradiation apparatus 1. In this state, the base stand 28 is disposed on the place where the charged particle beam irradiation apparatus 1 is disposed, for example, on the floor surface of the clean room. An elastic member (not shown) may be interposed between the base stand 28 and the floor surface where the charged particle beam irradiation apparatus 1 is disposed, so that a vibration-preventing function can be provided. In other words, by interposing the elastic member between the base stand 28 and the floor surface, external vibrations generated at the floor can be suppressed from being transferred to the apparatus body.

The vibration control apparatus 100 includes a plurality of acceleration sensors 29 arranged on the base stand 28. The acceleration sensors 29 are located on both ends of the base stand 28. Triaxial acceleration sensors are used as the acceleration sensors 29. The acceleration sensors 29 detect vibrations generated at the base stand 28 in the three axis directions mentioned above (X, Y, and Z axis directions) as vibration information. As well as the detection by the acceleration sensors 25, the acceleration sensors 29 detect external vibrations transferred from outside the charged particle beam irradiation apparatus 1 through the floor surface, and vibrations that occur while the stage 12 is moving.

The vibration information acquired by the acceleration sensor 29 is output to the controller 31. The controller 31 outputs the vibration information to the air pressure controller 33. The air pressure controller 33 controls the air pressure adjusting mechanism 32 to suppress the vibrations detected by the acceleration sensor 29, and adjust the air pressure in the third actuator units 5. The controller 31 may transmit the displacement of the mount 11 detected by the sensor 25a to the air pressure controller 33. In this case, the air pressure controller 33 adjusts the air pressure adjusting mechanism 32 of the third actuator units 5 so as to cancel the displacement (for example, inclination) of the mount 11. These components constitute a feedback control system to cancel the displacement of the mount 11 by the third actuator units 5 using the air pressure.

Furthermore, the air pressure controller 33 may control the air pressure adjusting mechanism 32 by feedforward control based on the position of the stage (coordinates), and movement information of the stage (the moving speed of the stage or the rate of acceleration of the stage) sent from the controller 31, in the same manner as in the actuator controller 4 which controls the first actuator units 2a and 2b, and the second actuator unit 3 using piezoelectric elements. The movement information of the stage (the moving speed of the stage or the rate of acceleration of the stage) is acquired from the position information of the stage 12 detected by the stage position detector 24.

Specifically, at least three third actuator units 5 are used to keep the mount 11 horizontal. In this embodiment, the charged particle beam irradiation apparatus 1 is supported by the third actuator units 5 arranged at the four corners of the rectangular mount 11. The third actuator units 5 also function as support legs that support the weight of the charged particle beam irradiation apparatus 1.

In this embodiment, the third actuator units 5 use, for example, pneumatic actuators, which expand and contract through utilization of air pressure. The third actuator units 5 are, for example, active dampers (active suspensions) or air cylinders. The vibration control apparatus 100 includes the air pressure adjusting mechanism 32 and the air pressure controller 33 to drive the third actuator units 5.

The air pressure adjusting mechanism 32 includes, for example, a compressor that supplies compressed air into air cylinders, and a valve to choose an actuator unit to which the compressed air is supplied and to adjust the air pressure. As described above, the air pressure controller 33 controls the compressor and solenoid valve of the air pressure adjusting mechanism 32, to reduce the vibrations of the mount 11, through the feedback control based on the vibration information of the mount 11, detected by the sensor 25a or the vibration information of the base stand 28, detected by the acceleration sensor 29, and through the feedforward control based on the position and movement information of the stage received from the controller 31.

In this embodiment, the third actuator units 5 are slower in response speed and greater in vibration suppression force compared to the first actuator units 2a and 2b and the second actuator unit 3. Therefore, the third actuator units 5 are effective against vibrations of large amplitudes. Furthermore, the third actuator units 5 are able to exert the vibration suppression force to a greater weight compared to the first actuator units 2a and 2b. In this embodiment, the third actuator units 5 support the weights of the mount 11, the chamber 21, and the optical column 27.

The air pressure adjusting mechanism 32 supplies the air compressed by the compressor to the third actuator units 5 formed of air springs, or exhausts the air through the valve in accordance with instructions from the air pressure controller 33, thereby expanding and contracting the third actuator units 5 to keep the mount 11 horizontal and reduce the vibrations of the mount 11.

The first example of placement of the actuator units (64 in FIG. 1) using piezoelectric elements relative to the mount 11 will be described with reference to FIG. 5. FIG. 5 is a schematic diagram showing the placement of the actuator units as viewed from the side of the electron gun 22 toward the mount 11.

The first example of placement is a standard placement. A first pair 20a of first actuator units 2a and 2b, and a second pair 20b of first actuator units 2a and 2b are arranged symmetrically with respect to an axis in the X axis direction passing through the center of gravity of the structure including the mount 11 and an object on the mount 11 (hereinafter referred to as "the center axis in the X direction"). The four actuator units are arranged in this manner (first position). As described above, the actuator units included in the first pair 20a and the second pair 20b are controlled by the actuator controller 4 to apply suppression forces in different directions in the Z axis direction to the mount 11.

The first pair 20a and the second pair 20b are controlled by the actuator controller 4 to apply the suppression forces in the same direction to the actuator units. Thus, the first pair 20a and the second pair 20b are arranged symmetrically with respect to the center axis in the X direction as the symmetry axis, and the actuator units at symmetric positions of the four corners of the mount 11 apply the suppression force to the mount 11 in the same direction (upward or downward) in the Z axis direction. Since the forces in the same direction are evenly applied to almost an entire surface of the mount 11, the situation where the first pair 20a and the second pair 20b bend the mount 11 is avoided.

The pair of second actuator units 3 are arranged at both ends of the mount 11 in a direction perpendicular to the center axis in the X direction (second position). The pair of second actuator units 3 apply suppression forces to the mount 11 in the same direction parallel to the direction of movement of the stage 12 (in the X axis direction in FIG. 5). In other words, the pair of second actuator units 3 apply suppression forces to the mount 11 in the same direction of the X axis direction at both ends of the mount 11 in the Y direction. Therefore, the situation where the mount 11 is rotated in the X-Y plane is avoided by the pair of second actuator units 3. The second actuator units 3, which generate the suppression forces in the same direction of the X axis direction, cancel the reaction force that occurs at the mount 11 due to the inertial force acting on the stage 12 in accordance with the movement (acceleration and deceleration) of the stage 12 in the X axis direction, thereby suppressing vibrations.

FIG. 5 shows an example of the placement of the actuator units in the case of performing continuous writing while the stage 12 is moving in the X axis direction. In the case of performing continuous writing while the stage 12 is moving in the Y axis direction, it is only necessary to exchange the positions where the first pair 20a and the second pair 20b are located for the positions where the two actuator units 3 are located. Namely, the first pair 20a and the second pair 20b are arranged symmetrically with respect to the center axis in the Y direction as the symmetry axis. The pair of second actuator units 3 are arranged at both ends of the mount 11 in the X axis direction.

In the first example of placement, all actuator units are not necessarily used. In accordance with the directions of suppression forces to be generated, only the first pair 20a and the second pair 20b (first actuator units) may be used, or only the pair of second actuator units 3 may be used, or both the first pair 20a and the second pair 20b and the pair of second actuator units 3 may be used.

A second example of placement of the actuator units relative to the mount 11, which is a target of vibration control, will be described with reference to FIG. 6. The way of viewing FIG. 6 is the same as that for FIG. 5.

In the second example of placement, a pair of first actuator units 2a and 2b, that apply a suppression force to the mount 11 in a direction perpendicular to the stage surface (the Z axis direction), are disposed at both ends of the mount 11 on the center axis in the X direction. A second actuator unit 3, that applies a suppression force to the mount 11 in a direction parallel to the direction of movement of the stage 12 (in the X axis direction in FIG. 6), is disposed near the center of gravity of the mount 11 (third position). In the second example of placement, since the pair of first actuator units 2a and 2b that generate the suppression force in the direction perpendicular to the stage surface are each disposed on the center axis, the mount 11 is prevented from bending.

Therefore, only the pair of first actuator units 2a and 2b may be used to generate the suppression force in a direction perpendicular to the stage surface. Furthermore, since the second actuator unit 3 that generates the suppression force in the direction parallel to the direction of movement of the stage 12 is disposed near the center of gravity of the mount 11, the situation where the second actuator unit 3 applies a moment in a horizontal direction to the mount 11 is avoided. Therefore, the single second actuator unit 3 can suppress vibrations of the mount 11. Also in the second example of the placement, all actuator units are not necessarily used. In accordance with the directions of suppression forces to be generated, only the pair of first actuator units 2a and 2b may be used, or only the single second actuator unit 3 may be used, or both the pair of first actuator units 2a and 2b and the single second actuator unit 3 may be used.

The third example of placement of the actuator units relative to the mount 11, which is a target of vibration control, will be described with reference to FIG. 7.

In the third example of placement, a pair of first actuator units 2a and 2b, that apply suppression forces in different directions perpendicular to the stage surface (the Z axis direction), are disposed at both end portions of the mount 11 symmetrically with respect to the center axis of the mount 11. Since the first actuator units 2a and 2b are disposed symmetrically with respect to a point, the mount 11 is prevented from bending. In a case of using a pair of second actuator units 3 that generate suppression forces in a direction parallel to the direction of movement of the stage 12 (the X axis direction), the pair of second actuator units 3 are not necessarily arranged in the Y axis direction. The pair of second actuator units 3 may be arranged at discretionary positions on both end portions along the X axis direction, as shown in FIG. 7.

In this embodiment, the movement information (the speed and the rate of acceleration) of the stage 12 is calculated based on the measurement of the distance to the stage 12 from the stage position detector 24.

Alternatively, writing pattern data input to the writing controller 35 can be utilized. The writing pattern data includes position information of the pattern to be written (coordinates of the writing position and an order of writing). The writing pattern data is stored in the memory 36. The controller 31 controls the stage moving mechanism 14 via the stage controller 15 to write patterns at a predetermined position in a predetermined order, while reading from the memory 36 the writing pattern data corresponding to the target object 17 on which the patterns are to be written.

Therefore, the controller 31 can estimate a movement of the stage 12 (coordinates of a position to be passed, a speed or a rate of acceleration in the X axis or Y axis direction) from the coordinates of a next position where the pattern is written. For example, the controller 31 can estimate writing position information (position information of the stage), a distance of movement, a moving speed and a rate of acceleration based on the set driving pattern of the stage 12. By inputting, for example, the estimated rate of acceleration of the stage 12 to the feedforward control system including the filter circuit 62 and the actuator unit 64 using a piezoelectric element shown in FIG. 1, a suppression force can be generated.

Although the writing pattern data has been described as an example, a high accuracy is required also in the case of using the vibration control apparatus 100 in a measurement apparatus or an inspection apparatus, such as an electron microscope. Therefore, the controller 31 can perform similar control functions by using the information of the measurement recipe instead of the writing pattern data described above. Furthermore, in this embodiment, the charged particle beam irradiation apparatus is used as a charged particle irradiation apparatus. However, the vibration control apparatus can be similarly applied to any apparatus in which vibrations are generated by movement of a stage or the like. Furthermore, the beam to be irradiated is not limited to the charged particle beam, but a light such as a laser, or electromagnetic wave such as an X ray, may be applied.

The present invention is not limited to the embodiments described above, and various modifications may be implemented without departing from the concept or scope of the present invention.

In the embodiments described above, descriptions for portions which are not directly necessary to explain the present invention, such as detailed configurations of devices and control methods, are omitted. However, it should be noted that the configurations of the devices and the control methods can be suitably selected and used if required. All inspection methods and inspection apparatuses that comprise the elements of the present invention and that can be suitably modified by a person ordinarily skilled in the art are encompassed in the scope of the present invention.

What is claimed is:

1. A charged particle beam irradiation apparatus comprising:
   an optical column including a charged particle beam irradiation mechanism configured to irradiate a charged particle beam to a target object;
   a stage including a stage surface on which the target object is to be placed, and configured to move in two orthogonal axis directions so that the charged particle beam is irradiated to a preset position on the target object;
   a mount supporting the stage;
   a chamber provided on the mount and supporting the optical column;
   a detector configured to detect movement of the stage;
   actuator units, each including:
      a curved plate formed of a flexible material,
      a piezoelectric element adhered to at least one surface of the curved plate and configured to change a curvature of the curved plate through expansion and contraction that occur due to application of a voltage, and
      a connector connected to a curved portion of the curved plate and configured to transmit a first force generated by a change of the curvature of the curved plate to the mount; and
   an actuator control circuit configured to control the voltage applied to the piezoelectric element of each of the actuator units based on movement information, so that the first force is transmitted from the actuator units to the mount against a second force acting on the mount due to the movement of the stage.

2. The apparatus according to claim 1, wherein:
   the actuator units include a pair of first actuator units disposed to transmit the first force to the mount in a direction perpendicular to the stage surface; and
   the actuator control circuit controls the voltage applied to the piezoelectric element of each of the pair of first actuator units, so that each of the pair of first actuator units transmits the first force to the mount against the second force acting on the mount in the direction perpendicular to the stage surface based on the movement information.

3. The apparatus according to claim 1, wherein:
   the actuator units include a second actuator unit disposed to transmit the first force to the mount in a direction parallel to the direction of the movement of the stage; and
   the actuator control circuit controls the voltage applied to the piezoelectric element of the second actuator unit, so that the second actuator unit transmits the first force to the mount against the second force acting on the mount in the direction parallel to the direction of the movement of the stage based on the movement information.

4. The apparatus according to claim 1, further comprising:
   a third actuator unit configured to transmit a third force to the mount in a gravity direction by expansion and contraction in the gravity direction by air pressure;

an air pressure adjustor configured to control the expansion and contraction of the third actuator unit by adjusting the air pressure supplied to the third actuator unit; and an air pressure control circuit configured to control the air pressure adjustor.

5. The apparatus according to claim 1, wherein the detector includes a position detector configured to measure a position of the stage relative to the mount.

6. The apparatus according to claim 1, wherein the actuator control circuit includes a filter circuit having a response characteristic to generate the first force at a preset frequency or a preset frequency band.

7. The apparatus according to claim 1, wherein:
the actuator units include two pairs of the first actuator its disposed to transmit the first force to the mount in the direction perpendicular to the stage surface; and
each of the two pairs of first actuator units are disposed to transmit the first force to symmetric positions of the mount with respect to a center axis passing through a center of gravity of the mount and parallel to a direction of movement of the stage as a symmetry axis.

8. The apparatus according to claim 7, wherein:
the actuator units further include the second actuator unit and another second actuator as a pair of second actuator units, both disposed to transmit the first force to the mount in the direction parallel to the direction of the movement of the stage; and
each of the pair of second actuator units are disposed at both ends of the mount in a direction perpendicular to the center axis, respectively.

9. The apparatus according to claim 7, wherein the two pairs of first actuator units are respectively disposed at both ends of the mount in a direction perpendicular to the center axis.

10. The apparatus according to claim 7, wherein the two pairs of first actuator units are disposed such that each pair is located at symmetric positions of the mount with respect to the center axis.

11. The apparatus according to claim 1, wherein:
the actuator units include a pair of first actuator units disposed to transmit the first force to the mount in a direction perpendicular to a direction of the movement of the stage, and a second actuator unit disposed to transmit the first force to the mount in a direction parallel to the direction of the movement of the stage;
each of the first actuator units are disposed at both ends of the mount on a center axis parallel to a direction of movement of the stage, respectively; and
the second actuator unit is disposed near a center of gravity of the mount.

12. The apparatus according to claim 1, wherein:
the actuator units include a pair of first actuator units disposed to transmit the first force to the mount in a direction perpendicular to a direction of the movement of the stage, and a pair of second actuator units disposed to transmit the first force to the mount in a direction parallel to the direction of the movement of the stage;
the first actuator units are respectively disposed at positions symmetric with respect to a center of gravity of the mount, at both ends of the mount in a direction parallel to a center axis of the mount, which is parallel to a direction of movement of the stage; and
the pair of second actuator units are respectively disposed at both ends of the mount in a direction perpendicular to the center axis passing through the center of gravity of the mount and parallel to the direction of movement of the stage.

13. The apparatus according to claim 2, wherein the actuator control circuit controls the voltage applied to the piezoelectric elements of the pair of first actuator units, so that the pair of first actuator units respectively transmit forces in different directions which are perpendicular to the stage surface relative to the mount.

14. The apparatus according to claim 5, wherein the detector calculates the movement information from position information detected by the position detector and from time information on measurement time.

15. The apparatus according to claim 4, further comprising an acceleration sensor configured to detect vibrations,
wherein the air pressure control circuit controls the air pressure adjustor based on vibration information received from the acceleration sensor.

16. The apparatus according to claim 1, wherein each of the actuator units further includes:
first and second rotation shafts attached to both ends of the curved plate;
a fixed bearing to which the first rotation shaft is attached;
a movable bearing to which the second rotation shaft is attached; and
a pedestal to which the fixed bearing and the movable bearing are attached.

17. The apparatus according to claim 2, wherein each of the first actuator units is disposed so that a curved top portion of the curved plate is directed in the direction perpendicular to the stage surface.

18. The apparatus according to claim 3, wherein the second actuator unit is disposed so that a curved top portion of the curved plate is directed in the direction parallel to the direction of the movement of the stage.

* * * * *